United States Patent
Jiang et al.

(10) Patent No.: US 10,818,490 B2
(45) Date of Patent: Oct. 27, 2020

(54) CONTROLLED GROWTH OF THIN SILICON OXIDE FILM AT LOW TEMPERATURE

(71) Applicant: Applied Materials, Inc., Santa Clara, CA (US)

(72) Inventors: Shishi Jiang, Santa Clara, CA (US); Kurtis Leschkies, San Jose, CA (US); Pramit Manna, Sunnyvale, CA (US); Abhijit Basu Mallick, Fremont, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/201,095

(22) Filed: Nov. 27, 2018

(65) Prior Publication Data

US 2019/0189435 A1   Jun. 20, 2019

Related U.S. Application Data

(60) Provisional application No. 62/599,200, filed on Dec. 15, 2017.

(51) Int. Cl.
*H01L 21/02* (2006.01)
*C23C 8/10* (2006.01)
(Continued)

(52) U.S. Cl.
CPC .......... *H01L 21/02236* (2013.01); *C23C 8/10* (2013.01); *H01L 21/02164* (2013.01);
(Continued)

(58) Field of Classification Search
CPC ....... C23C 8/16; C23C 8/10; H01L 21/32105; H01L 21/02164; H01L 21/0223–02238
See application file for complete search history.

(56) References Cited

U.S. PATENT DOCUMENTS 4,268,538 A   5/1981   Toole et al.
5,132,765 A * 7/1992   Blouse .............. H01L 21/28525
                                                        257/198

(Continued)

OTHER PUBLICATIONS

Kuppurao et al., "In Situ Steam Generation: A New Rapid Thermal Oxidation Technique", Jul. 1, 2000, Solid State Technology, vol. 43, Issue 7. (Year: 2000).*

(Continued)

*Primary Examiner* — Selim U Ahmed
*Assistant Examiner* — Evan G Clinton
(74) *Attorney, Agent, or Firm* — Patterson + Sheridan, LLP (57) ABSTRACT

Implementations described herein generally relate to methods for forming a low-k dielectric material on a semiconductor substrate. More specifically, implementations described herein relate to methods of forming a silicon oxide film at high pressure and low temperatures. In one implementation, a method of forming a silicon oxide film is provided. The method comprises loading a substrate having a silicon-containing film formed thereon into a processing region of a high-pressure vessel. The method further comprises forming a silicon oxide film on the silicon-containing film. Forming the silicon oxide film on the silicon-containing film comprises exposing the silicon-containing film to a processing gas comprising steam at a pressure greater than about 1 bar and maintaining the high-pressure vessel at a temperature between about 100 degrees Celsius and about 500 degrees Celsius.

20 Claims, 5 Drawing Sheets

(51) Int. Cl.
*H01L 21/321* (2006.01)
*H01L 21/67* (2006.01)
*H01L 21/677* (2006.01)

(52) U.S. Cl.
CPC .. *H01L 21/32105* (2013.01); *H01L 21/67109* (2013.01); *H01L 21/67754* (2013.01)

(56) References Cited

U.S. PATENT DOCUMENTS

| | | |
|---|---|---|
| 8,445,078 B2 | 5/2013 | Liang et al. |
| 8,481,123 B2 | 7/2013 | Kim et al. |
| 2007/0187386 A1 | 8/2007 | Kim et al. |
| 2009/0020851 A1* | 1/2009 | Liu .................. H01L 29/41708 257/565 |
| 2017/0005188 A1* | 1/2017 | Cheng .................. H01L 29/785 |
| 2017/0148624 A1 | 5/2017 | Verhaverbeke et al. |

OTHER PUBLICATIONS

L.E. Katz et al., "Low Temperature, High Pressure Steam Oxidation of Silicon", Oct. 1979, Journal of the Electrochemical Society, vol. 126, pp. 1822-1824 (Year: 1979).*

\* cited by examiner

CONTROLLED GROWTH OF THIN SILICON OXIDE FILM AT LOW TEMPERATURE

CROSS-REFERENCE TO RELATED APPLICATIONS

This application claims benefit of U.S. provisional patent application Ser. No. 62/599,200, filed Dec. 15, 2017, which is incorporated herein by reference in its entirety.

BACKGROUND

Field

Implementations described herein generally relate to methods for forming a low-k dielectric material on a semiconductor substrate. More specifically, implementations described herein relate to methods of forming a silicon oxide film at high pressure and low temperatures.

Description of the Related Art

Formation of semiconductor devices, such as memory devices, logic devices, microprocessors, etc. involves deposition of low-k dielectric films over semiconductor substrates. The low-k dielectric film is used to make the circuitry for manufacturing the device. Current dry or wet silicon oxidation techniques are often performed at temperatures greater than 800 degrees Celsius. However, materials deposited on the semiconductor substrate may not survive temperatures greater than 800 degrees Celsius. As a result, the low-k dielectric film may not be deposited at a temperature greater than a thermal budget of 800 degrees Celsius. However, films deposited within the thermal budget often suffer from poor quality.

Thus, there is a need for a method of depositing high quality low-k dielectric films at temperatures that meet thermal budget targets.

SUMMARY

Implementations described herein generally relate to methods for forming a low-k dielectric material on a semiconductor substrate. More specifically, implementations described herein relate to methods of forming a silicon oxide film at high pressure and low temperatures. In one implementation, a method of forming a silicon oxide film is provided. The method comprises loading a substrate having a silicon-containing film formed thereon into a processing region of a high-pressure vessel. The method further comprises forming a silicon oxide film on the silicon-containing film. Forming the silicon oxide film on the silicon-containing film comprises exposing the silicon-containing film to a processing gas comprising steam at a pressure greater than about 1 bar and maintaining the high-pressure vessel at a temperature between about 100 degrees Celsius and about 500 degrees Celsius.

In another implementation, a method of forming a silicon oxide film is provided. The method comprises loading a substrate having a silicon-containing film formed thereon into a processing region of a high-pressure vessel and forming a silicon oxide film on the silicon-containing film. Forming the silicon oxide film comprises ramping a temperature of the high-pressure vessel to a target temperature between about 100 degrees Celsius and about 500 degrees Celsius. Forming the silicon oxide film further comprises exposing the silicon-containing film to a processing gas comprising steam. Forming the silicon oxide film further comprises ramping pressure within the processing region to a target pressure while exposing the silicon-containing film to the processing gas comprising steam, wherein the target pressure is greater than about 1 bar.

In yet another implementation, a method of forming a silicon oxide film is provided. The method comprises loading a substrate having a silicon-containing film formed thereon into a processing region of a high-pressure vessel and forming a silicon oxide film on the silicon-containing film. Forming the silicon oxide film on the silicon-containing film comprises ramping a temperature of the high-pressure vessel to a target temperature between about 100 degrees Celsius and about 500 degrees Celsius and a target pressure greater than about 1 bar. A water source is positioned in the processing region. Forming the silicon oxide film on the silicon-containing film further comprises exposing the silicon-containing film to a processing gas comprising steam formed from the water source.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods of forming silicon oxide films at high pressure and low temperatures. Certain details are set forth in the following description and in FIGS. 1-5 to provide a thorough understanding of various implementations of the disclosure. Other details describing well-known structures and systems often associated with high-pressure oxidation are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high-pressure oxidation process that can be carried out using a high-pressure oxidation system. The apparatus description described herein, in FIG. 1 is illustrative, and should not be construed or interpreted as limiting the scope of the implementations described herein.

Figure 1:
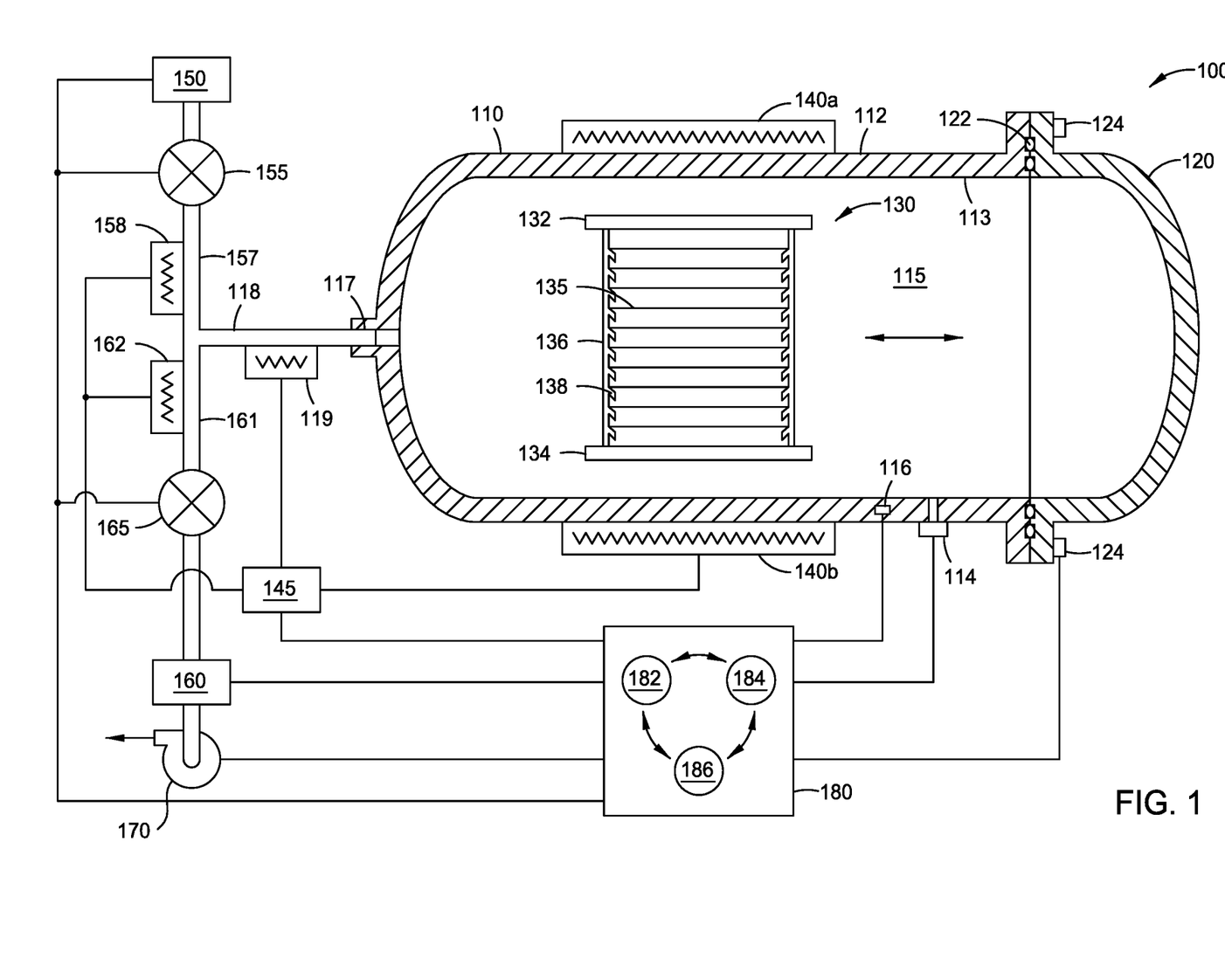
FIG. 1 depicts a simplified front cross-sectional view of one example of a high-pressure vessel that may be used to practice one or more implementations described herein.

FIG. 1 is simplified front cross-sectional view of a high-pressure vessel 100 for the high-pressure annealing process. The high-pressure vessel 100 has a body 110 with an outer surface 112 and an inner surface 113 that encloses a processing region 115. In some implementations such as in FIG. 1, the body 110 has an annular cross section, though in other implementations, the cross-section of the body 110 may be rectangular or any closed shape. The outer surface 112 of the body 110 may be made from a corrosion resistant steel (CRS), such as but not limited to stainless steel. In one implementation, the inner surface 113 of the body 110 is made from nickel-based steel alloys that exhibit high resistance to corrosion, such as but not limited to Hastelloy®.

The high-pressure vessel 100 has a door 120 configured to sealably enclose the processing region 115 within the body 110 such that the processing region 115 can be accessed when the door 120 is open. A high-pressure seal 122 is utilized to seal the door 120 to the body 110 in order to seal the processing region 115 for processing. The high-pressure seal 122 may be made from a polymer, such as but not limited to a perfluoroelastomer. A cooling channel 124 is disposed on the door 120 adjacent to the high-pressure seal 122 in order to maintain the high-pressure seal 122 below the maximum safe-operating temperature of the high-pressure seal 122 during processing. A cooling agent, such as but not limited to an inert, dielectric, and/or high-performance heat transfer fluid, may be circulated within the cooling channel 124 to maintain the high-pressure seal 122 at a temperature between about 150 degrees Celsius and 250 degrees Celsius. The flow of the cooling agent within the cooling channel 124 is controlled by a controller 180 through feedback received from a temperature sensor 116 or a flow sensor (not shown).

The high-pressure vessel 100 has a port 117 through the body 110. The port 117 has a pipe 118 therethrough, which is coupled to a heater 119. One end of the pipe 118 is connected to the processing region 115. The other end of the pipe 118 bifurcates into an inlet conduit 157 and an outlet conduit 161. The inlet conduit 157 is fluidly connected to a gas panel 150 via an isolation valve 155. The inlet conduit 157 is coupled to a heater 158. The outlet conduit 161 is fluidly connected to a condenser 160 via an isolation valve 165. The outlet conduit 161 is coupled to a heater 162. The heaters 119, 158 and 162 are configured to maintain a processing gas flowing through the pipe 118, inlet conduit 157 and the outlet conduit 161 respectively at a temperature between the condensation point of the processing gas and about 250 degrees Celsius. The heaters 119, 158 and 162 are powered by a power source 145.

The gas panel 150 is configured to provide a processing gas comprising an oxidizer under pressure into the inlet conduit 157 for transmission into the processing region 115 through the pipe 118. The pressure of the processing gas introduced into the processing region 115 is monitored by a pressure sensor 114 coupled to the body 110. The condenser 160 is fluidly coupled to a cooling fluid and configured to condense a gaseous product flowing through the outlet conduit 161 after removal from the processing region 115 through the pipe 118. The condenser 160 converts the gaseous products from the gas phase into liquid phase. A pump 170 is fluidly connected to the condenser 160 and pumps out the liquefied products from the condenser 160. The operation of the gas panel 150, the condenser 160 and the pump 170 are controlled by the controller 180.

The isolation valves 155 and 165 are configured to allow only one fluid to flow through the pipe 118 into the processing region 115 at a time. When the isolation valve 155 is open, the isolation valve 165 is closed such that a processing gas flowing through inlet conduit 157 enters into the processing region 115, preventing the flow of the processing gas into the condenser 160. On the other hand, when the isolation valve 165 is open, the isolation valve 155 is closed such that a gaseous product is removed from the processing region 115 and flows through the outlet conduit 161, preventing the flow of the gaseous product into the gas panel 150.

One or more heaters 140a, 140b (collectively 140) are disposed on the body 110 and configured to heat the processing region 115 within the high-pressure vessel 100. In some implementations, the heaters 140 are disposed on an outer surface 112 of the body 110 as shown in FIG. 1, though in other implementations, the heaters 140 may be disposed on an inner surface 113 of the body 110. Each of the heaters 140 may be a resistive coil, a lamp, a ceramic heater, a graphite-based carbon fiber composite (CFC) heater, a stainless steel heater or an aluminum heater. The heaters 140 are powered by the power source 145. Power to the heaters 140 is controlled by the controller 180 through feedback received from the temperature sensor 116. The temperature sensor 116 is coupled to the body 110 and monitors the temperature of the processing region 115.

A cassette 130 coupled to an actuator (not shown) is moved in and out of the processing region 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the high-pressure vessel 100 and for processing the plurality of substrates 135 in the processing region 115.

The controller 180 controls the operation of the high-pressure vessel 100. The controller 180 controls the operation of the gas panel 150, the condenser 160, the pump 170, the isolation valve 155 and the isolation valve 165 as well as the power source 145. The controller 180 is also communicatively connected to the temperature sensor 116, the pressure sensor 114 and the cooling channel 124. The controller 180 includes a central processing unit (CPU) 182, a memory 184, and a support circuit 186. The CPU 182 may be any form of a general-purpose computer processor that may be used in an industrial setting. The memory 184 may be a random access memory, a read-only memory, a floppy, or a hard disk drive, or other form of digital storage. The support circuit 186 is conventionally coupled to the CPU 182 and may include cache, clock circuits, input/output systems, power supplies, and the like.

The high-pressure vessel 100 provides a convenient chamber to perform the method of forming a silicon oxide film on the plurality of substrates 135 at a temperature of 500 degrees Celsius or less. The heaters 140 are powered on to pre-heat the high-pressure vessel 100 and maintain the processing region 115 at a temperature of 500 degrees Celsius or less. At the same time, the heaters 119, 158 and 162 are powered on to pre-heat the pipe 118, the inlet conduit 157 and the outlet conduit 161 respectively.

The plurality of substrates 135 are loaded on the cassette 130. The door 120 of the high-pressure vessel 100 is opened to move the cassette 130 into the processing region 115. The door 120 is then sealably closed to turn the high-pressure vessel 100 into a high-pressure vessel. The high-pressure seal 122 ensures that there is no leakage of pressure from the processing region 115 once the door 120 is closed.

A processing gas is provided by the gas panel 150 into the processing region 115 inside the high-pressure vessel 100. The isolation valve 155 is turned on by the controller 180 to allow the processing gas to flow through the inlet conduit 157 and the pipe 118 into the processing region 115. The processing gas is introduced at a flow rate of between, for example, about 500 sccm and about 2000 sccm. The isolation valve 165 remains off at this time. The processing gas includes steam and optionally an additional oxidizer flowed into the processing region 115. In some implementations, the pressure in the high-pressure vessel 100 is increased incrementally. The high pressure is effective in driving oxygen into the silicon-containing film into a more complete oxidation state, particularly in the deeper portions of the trenches. In some implementations described herein, the processing gas is steam under a pressure between about 1 bar and about 70 bar (e.g., between about 5 bar and about 40 bar; or between about 30 bar and 40 bar). However, in other implementations, other oxidizers, such as but not limited to ozone, oxygen, a peroxide or a hydroxide-containing compound may be used with the steam. The isolation valve 155 is turned off by the controller 180 when sufficient steam has been released by the gas panel 150.

During processing of the substrates 135, the processing region 115 as well as the inlet conduit 157, the outlet conduit 161 and the pipe 118 are maintained at a temperature and pressure such that the processing gas stays in gaseous phase. The temperatures of the processing region 115 as well as the inlet conduit 157, the outlet conduit 161 and the pipe 118 are maintained at a temperature greater than the condensation point of the processing gas (e.g., 100 degrees Celsius) at the applied pressure but at 500 degrees Celsius or less. The processing region 115 as well as the inlet conduit 157, the outlet conduit 161 and the pipe 118 are maintained at a pressure less than the condensation pressure of the processing gas at the applied temperature. The processing gas is selected accordingly. In the implementation described herein, steam under a pressure of between about 1 bar and about 70 bar is an effective processing gas, when the high-pressure vessel is maintained at a temperature between about 100 degrees Celsius and about 500 degrees Celsius. This ensures that the steam does not condense into water, which is harmful for the silicon film deposited on the substrate 135.

The processing is complete when the film is observed to have the targeted density, as verified by testing the wet etch rate of the film and electrical leakage and breakdown characteristics. The isolation valve 165 is then opened to flow the processing gas from the processing region 115 through the pipe 118 and outlet conduit 161 into the condenser 160. The processing gas is condensed into liquid phase in the condenser 160. The liquefied processing gas then removed by the pump 170. When the liquefied processing gas is completely removed, the isolation valve 165 closes. The heaters 140, 119, 158 and 162 are then powered off. The door 120 of the high-pressure vessel 100 is then opened to remove the cassette 130 from the processing region 115.

Figure 2:
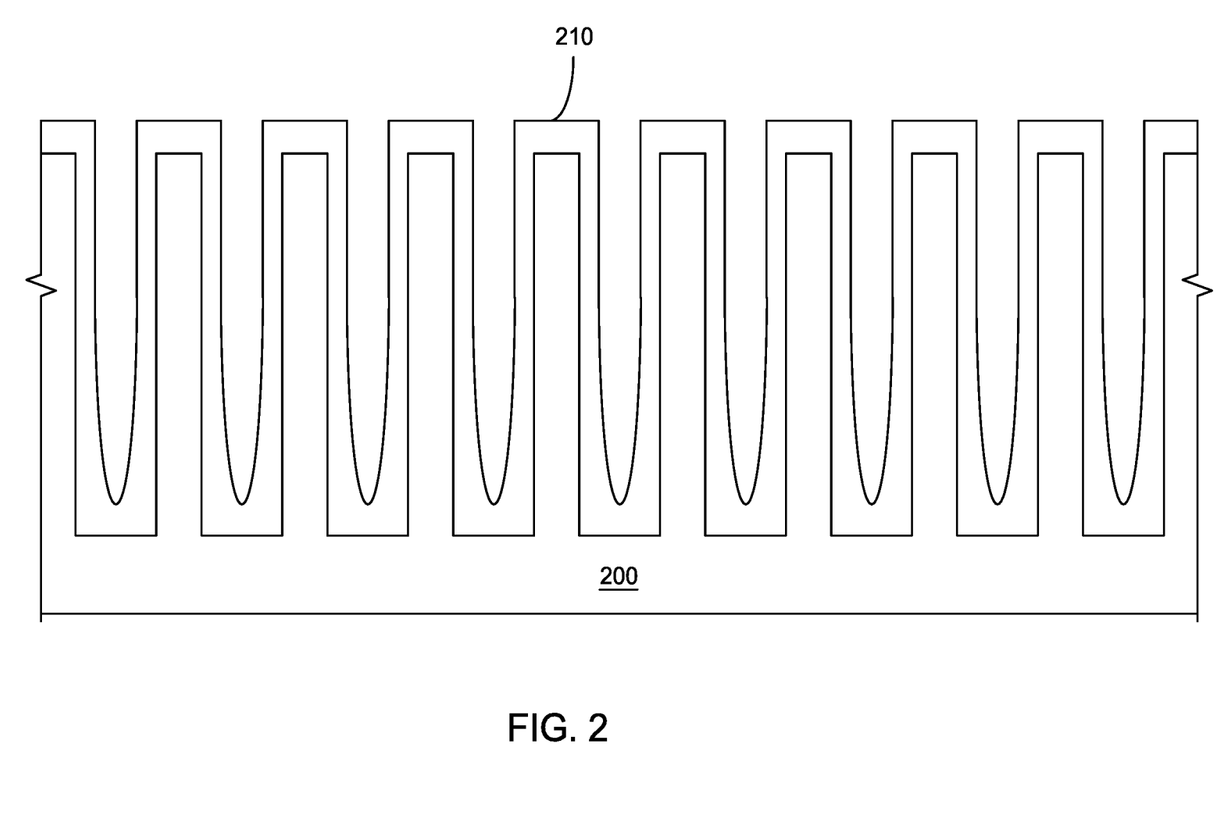
FIG. 2 depicts a simplified cross-sectional view of one example of a silicon oxide film formed in accordance with one or more implementations described herein.

FIG. 2 depicts a simplified cross-sectional view of one example of a silicon oxide film 210 formed on a semiconductor substrate 200 in accordance with one or more implementations described herein. The semiconductor substrate 200 may be used in place of each of the substrates 135 when loaded on the cassette 130, as shown in FIG. 1. The semiconductor substrate 200 has a silicon oxide film 210 deposited thereon at a temperature of 500 degrees Celsius or less.

Figure 3:
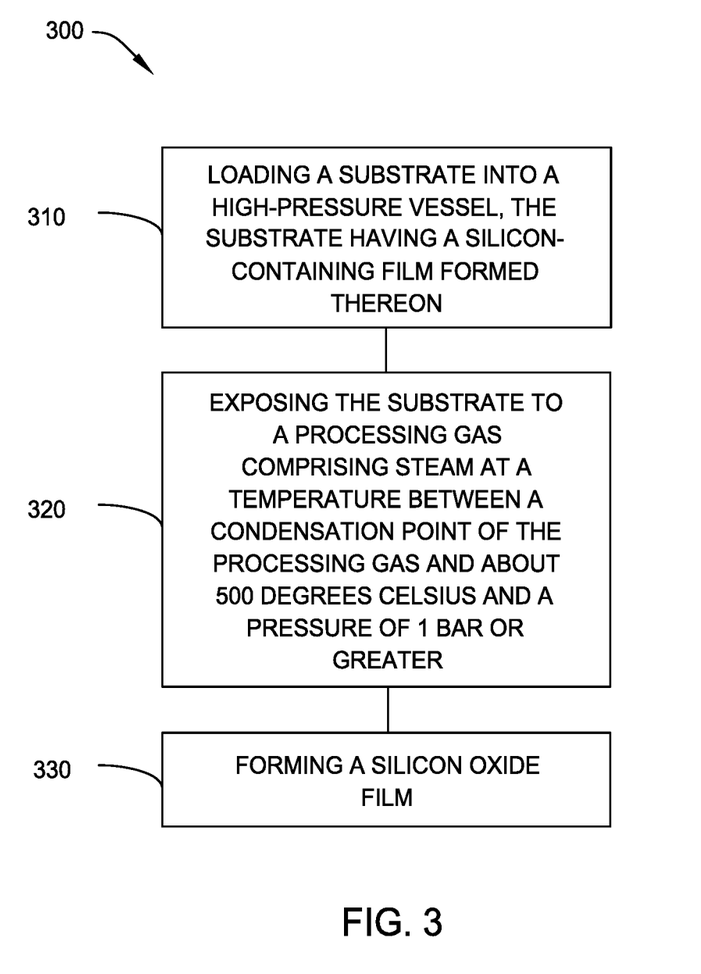
FIG. 3 depicts a process flow diagram of a method for forming a silicon oxide film on a substrate in accordance with one or more implementations described herein.

FIG. 3 depicts a process flow diagram of a method 300 for forming a silicon oxide film on a substrate in accordance with one or more implementations described herein. The method 300 begins at operation 310 by loading a substrate into a high-pressure vessel, the substrate having a silicon-containing film formed thereon. The substrate may be substrate 135 as depicted in FIG. 1 or the semiconductor substrate 200 as depicted in FIG. 2. In one implementation, a surface of the substrate is substantially planar. Alternatively, the substrate may have patterned structures, for example, a surface having trenches, holes, or vias formed therein. The substrate may also have a substantially planar surface having a structure formed thereon or therein at a targeted elevation. The substrate may contain one or more materials used in forming semiconductor devices such as metal contacts, trench isolations, gates, bitlines, or any other interconnect features. The substrate may comprise one or more metal layers, one or more dielectric materials, semiconductor material, and combinations thereof utilized to fabricate semiconductor devices. For example, the substrate may include an oxide material, a nitride material, a polysilicon material, or the like, depending upon application. In one implementation where a memory application is targeted, the substrate may include the silicon substrate material, an oxide material, and a nitride material, with or without polysilicon sandwiched in between.

In another implementation, the substrate may include a plurality of alternating oxide and nitride materials (i.e., oxide-nitride-oxide (ONO)) (not shown) deposited on the surface of the substrate. In various implementations, the substrate may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate may be any substrate or material surface upon which film processing is performed. For example, the substrate may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

The high-pressure vessel may be the high-pressure vessel 100 depicted in FIG. 1. The substrate may be positioned in a cassette such as cassette 130 as shown in FIG. 1. In one implementation, the silicon-containing film is a polysilicon film.

At operation 320, the substrate is exposed to a processing gas comprising steam at a target temperature between a condensation point of the processing gas (e.g., about 100 degrees Celsius) and about 500 degrees Celsius and a pressure greater than 1 bar. In one implementation, the target temperature is between about 100 degrees Celsius and about 500 degrees Celsius (e.g., between about 200 degrees Celsius and about 500 degrees Celsius; or between about 400 degrees Celsius and about 500 degrees Celsius). The temperature may be ramped to the target temperature using the heaters 140a, 140b. In one implementation, the pressure is between about 1 bar and about 70 bar (e.g., between about 10 bar and about 50 bar; between about 5 bar to about 35 bar; or between about 30 bar to about 40 bar).

In one implementation, the processing gas comprises steam and an additional oxidizer. In one implementation, the additional oxidizer is selected from a group consisting of ozone, oxygen, water vapor, heavy water, a peroxide, a hydroxide-containing compound, oxygen isotopes (14, 15, 15, 17, 18, etc.) and hydrogen isotopes (1, 2, 3) and combinations thereof. The peroxide may be hydrogen peroxide in a gaseous phase. In some implementations, the oxidizer comprises a hydroxide ion, such as, but not limited to water vapor or heavy water in vapor form. In some implementations, the substrate or the plurality of substrates are exposed to steam at a pressure between about 5 bar to about 35 bar, where the pressure is incrementally increased from 5 bar to about 35 bar. In some implementations, steam is introduced into the high-pressure vessel at a flow rate of between, for example, between about 500 sccm and about 5,000 sccm (e.g., between about 500 sccm and about 5,000 sccm; or between about 500 sccm and about 2,000 sccm. In one implementation, water vapor is injected into the high-pressure vessel and the water vapor forms steam upon being heated in the high-pressure vessel. In another implementation, water is present in the high-pressure vessel prior to heating to the target temperature. The water present in the high-pressure vessel forms steam as the high-pressure vessel is heated to the target temperature.

At operation 330, a silicon oxide film is formed on the substrate. At operation 330, the high-pressure vessel is maintained at a temperature between a condensation point of the processing gas and about 500 degrees Celsius, while the substrate with the silicon-containing film is exposed to the processing gas to form the silicon oxide film. In one implementation, where steam at a pressure between about 5 bar to about 35 bar is used, the temperature of the high-pressure vessel is maintained between about 150 degrees Celsius and about 250 degrees Celsius. In some implementations, forming the silicon oxide film on the substrate of operation 330 is performed for a time-period between about 5 minutes to about 120 minutes.

Application of a processing gas comprising steam and optionally an oxidizer under high pressure allows a high concentration of the oxidizing species from the processing gas to infiltrate deeply into the silicon-containing film such that the oxidizing species can produce more of the silicon oxide film material through oxidation. Not to be bound by theory but it is believed that the high pressure inside the high-pressure vessel drives the diffusion of the oxidizing species into deeper trenches. In addition, it is believed that the presence of steam allows the target pressure to be achieved at a much faster rate.

Figure 4:
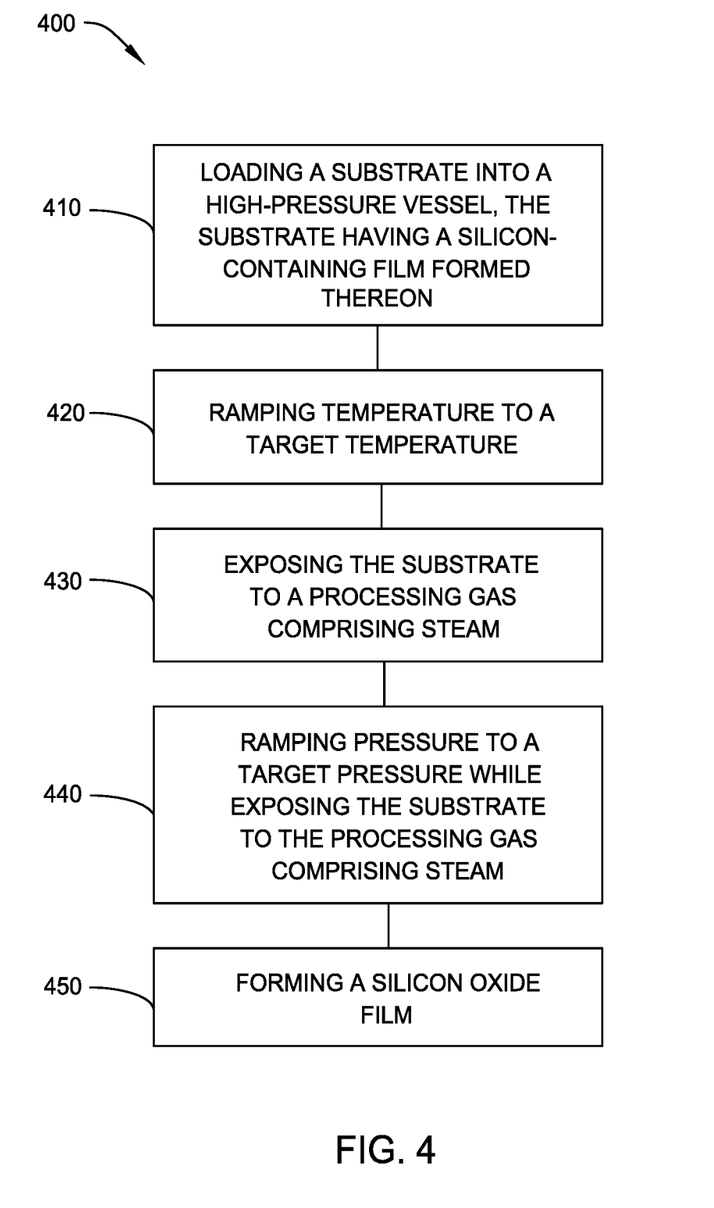
FIG. 4 depicts a process flow diagram of another method for forming a silicon oxide film on a substrate in accordance with one or more implementations described herein.

FIG. 4 depicts a process flow diagram of another method 400 for forming a silicon oxide film on a substrate in accordance with one or more implementations described herein. The method 400 begins at operation 410 by loading a substrate into a high-pressure vessel, the substrate having a silicon-containing film formed thereon. The substrate may be the substrate 135 as depicted in FIG. 1 or the semiconductor substrate 200 as depicted in FIG. 2. The high-pressure vessel may be the high-pressure vessel 100 depicted in FIG. 1. The substrate may be positioned in a cassette such as cassette 130 as shown in FIG. 1. In one implementation, the silicon-containing film is a polysilicon film.

At operation 420, the temperature is ramped to a target temperature. In one implementation, the target temperature is between about 100 degrees Celsius and about 500 degrees Celsius (e.g., between about 200 degrees Celsius and about 500 degrees Celsius; or between about 400 degrees Celsius and about 500 degrees Celsius). The temperature may be ramped to the target temperature using the heaters 140a, 140b.

At operation 430, the substrate is exposed to a processing gas comprising steam. In some implementations, operation 430 overlaps with operation 420, for example, the processing gas is flowed into the high-pressure vessel while the temperature is ramped during operation 420. In some implementations, the processing gas is introduced into the high-pressure vessel at a flow rate of between, for example, between about 500 sccm and about 5,000 sccm (e.g., between about 500 sccm and about 5,000 sccm; or about 500 sccm and about 2,000 sccm. In one implementation, water vapor is injected into the high-pressure vessel and the water vapor forms steam upon being heated in the high-pressure vessel.

At operation 440, the substrate is exposed to a processing gas comprising steam while ramping the pressure within the processing region of the high-pressure vessel to a target pressure. In one implementation, the target pressure is between about 1 bar and about 70 bar (e.g., between about 10 bar and about 50 bar; between about 5 bar to about 35 bar; or between about 30 bar to about 40 bar).

At operation 450, a silicon oxide film is formed on the substrate. At operation 450, the high-pressure vessel is maintained at a temperature between a condensation point of the processing gas and about 500 degrees Celsius, while the substrate with the silicon-containing film is exposed to the processing gas to form the silicon oxide film. In one implementation, where steam at a pressure between about 5 bar to about 35 bar is used, the temperature of the high-pressure vessel is maintained between about 150 degrees Celsius and about 250 degrees Celsius. In some implementations, forming the silicon oxide film on the substrate of operation 450 is performed for a time-period between about 5 minutes to about 120 minutes.

Figure 5:
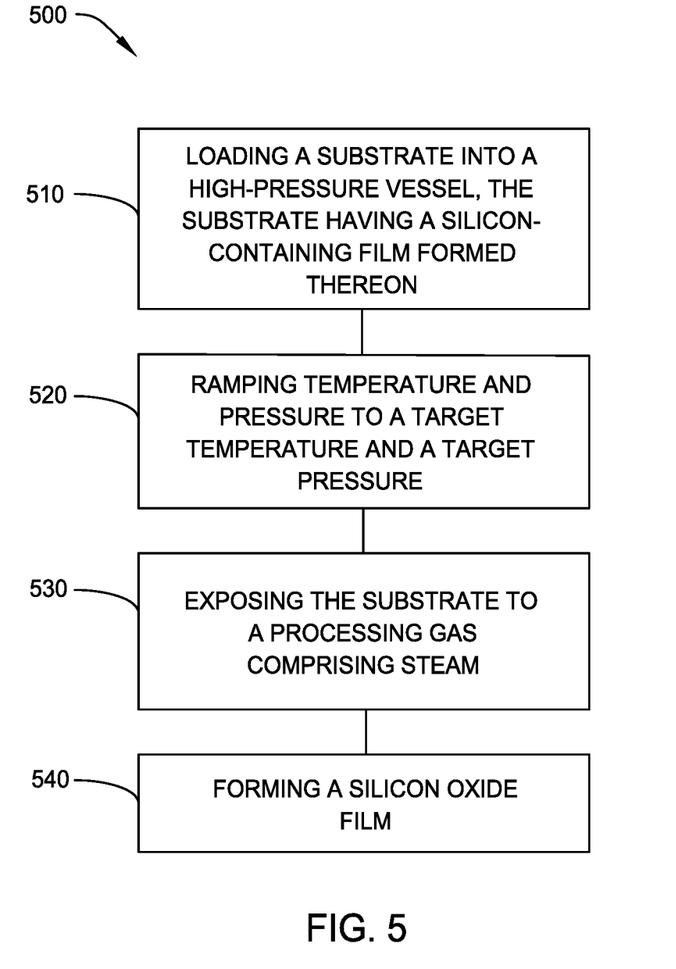
FIG. 5 depicts a process flow diagram of another method for forming a silicon oxide film on a substrate in accordance with one or more implementations described herein.

FIG. 5 depicts a process flow diagram of another method 500 for forming a silicon oxide film on a substrate in accordance with one or more implementations described herein. The method 500 is similar to method 400 except that water is present in the high-pressure vessel 100 prior to ramping the temperature to a target temperature at operation 520. The water present in the high-pressure vessel forms steam as the high-pressure vessel is heated to the target temperature.

The method 500 begins at operation 510 by loading a substrate into a high-pressure vessel, the substrate having a silicon-containing film formed thereon. The substrate may be the substrate 135 as depicted in FIG. 1 or the semiconductor substrate 200 as depicted in FIG. 2. The high-pressure vessel may be the high-pressure vessel 100 depicted in FIG. 1. The substrate may be positioned in a cassette such as the cassette 130 as shown in FIG. 1. In one implementation, the silicon-containing film is a polysilicon film.

Prior to operation 520, water is introduced into the processing region of the high-pressure vessel. The water may be positioned in the processing region in a vessel. In another implementation, water vapor is injected into the processing region prior to operation 520.

At operation 520, the temperature is ramped to a target temperature and the pressure is ramped to a target pressure. In one implementation, the target temperature is between about 100 degrees Celsius and about 500 degrees Celsius (e.g., between about 200 degrees Celsius and about 500 degrees Celsius; or between about 400 degrees Celsius and about 500 degrees Celsius). While ramping to the target temperature, water is converted into steam in the processing region. In one implementation, the target pressure is between about 1 bar and about 70 bar (e.g., between about 10 bar and about 50 bar; between about 5 bar to about 35 bar; or between about 30 bar to about 40 bar). In some implementations, the substrate or the plurality of substrates are exposed to steam at a pressure between about 5 bar to about 35 bar, where the pressure is incrementally increased from 5 bar to about 35 bar.

At operation 530, the substrate is exposed to the steam in the processing region. In some implementations, operation 530 overlaps with operation 520. For example, when the temperature of the chamber in operation 520 reaches the condensation point of water, steam is formed and the substrate is exposed to steam. In some implementations, a processing gas comprising an additional oxidant is introduced into the processing region during operation 530. In some implementations, the processing gas comprising the additional oxidant is introduced into the high-pressure vessel at a flow rate of between, for example, between about 500 sccm and about 2,000 sccm. In one implementation, the oxidizer is selected from a group consisting of ozone, oxygen, water vapor, heavy water, a peroxide, a hydroxide-containing compound, oxygen isotopes (14, 15, 15, 17, 18, etc.) and hydrogen isotopes (1, 2, 3) and combinations thereof. The peroxide may be hydrogen peroxide in a gaseous phase. In some implementations, the oxidizer comprises a hydroxide ion, such as, but not limited to water vapor or heavy water in vapor form.

At operation 540, a silicon oxide film is formed on the substrate. At operation 540, the high-pressure vessel is maintained at a temperature between a condensation point of the processing gas and about 500 degrees Celsius, while the substrate with the silicon-containing film is exposed to the processing gas to form the silicon oxide film. In one implementation, where steam at a pressure between about 5 bar to about 35 bar is used, the temperature of the high-pressure vessel is maintained between about 150 degrees Celsius and about 250 degrees Celsius. In some implementations, forming the silicon oxide film on the substrate of operation 540 is performed for a time-period between about 5 minutes to about 120 minutes.

The quality of the processed film formed can be verified by a reduction in wet etch rate of the film by about two-third, as compared to the quality of the film before the process. The quality of the processed film can also be verified by testing electrical properties such as breakdown voltage, leakage current, etc. For a process performed at a relatively low temperature of 500 degrees Celsius or less, the achievement in film quality improvement is substantially similar to a process performed at 500 degrees Celsius at atmospheric pressure. Moreover, the time to complete the high-pressure steam annealing of the film between about 150 degrees Celsius and about 250 degrees Celsius is about 30 minutes, which makes the process relatively faster than a conventional steam annealing process performed at high temperatures and under atmospheric pressure.

In summary, some benefits of the some of the implementations described herein include the ability to form high quality silicon oxide films at high pressure and low temperatures, which meet current thermal budget targets.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of forming a silicon oxide film, comprising:
   loading a substrate having a silicon-containing film formed thereon into a processing region of a high-pressure vessel; and
   forming a silicon oxide film on the silicon-containing film, comprising:
      ramping a temperature of the high-pressure vessel to a target temperature between about 100 degrees Celsius and about 500 degrees Celsius,
      wherein water is positioned in the processing region prior to ramping the temperature of the high-pressure vessel to the target temperature, and wherein the water vaporizes in the processing region to form steam;
      exposing the silicon-containing film to a processing gas comprising the steam at a pressure greater than about 1 bar; and
      maintaining the high-pressure vessel at the target temperature between about 100 degrees Celsius and about 500 degrees Celsius.

2. The method of claim 1, wherein forming the silicon oxide film on the silicon-containing film is performed for a time-period between about 5 minutes to about 120 minutes.

3. The method of claim 1, wherein the pressure is between about 1 bar and about 70 bar.

4. The method of claim 3, wherein the pressure is between about 5 bar to about 35 bar.

5. The method of claim 1, wherein the processing gas further comprises an oxidizer.

6. The method of claim 5, wherein the oxidizer is selected from a group of ozone, oxygen, water vapor, heavy water, a peroxide, a hydroxide-containing compound, oxygen isotopes and hydrogen isotopes.

7. The method of claim 1, wherein the temperature is between about 400 degrees Celsius and about 500 degrees Celsius.

8. The method of claim 7, wherein the pressure is between about 30 bar and about 40 bar.

9. A method of forming a silicon oxide film, comprising:
   loading a substrate having a silicon-containing film formed thereon into a processing region of a high-pressure vessel; and
   forming a silicon oxide film on the silicon-containing film, comprising:
      ramping a temperature of the high-pressure vessel to a target temperature between about 100 degrees Celsius and about 500 degrees Celsius, wherein water is positioned in the processing region prior to ramping the temperature of the high-pressure vessel to the target temperature, and wherein the water vaporizes in the processing region to form steam;

exposing the silicon-containing film to a processing gas comprising the steam; and ramping pressure within the processing region to a target pressure while exposing the silicon-containing film to the processing gas comprising the steam, wherein the target pressure is greater than about 1 bar.

10. The method of claim 9, further comprising maintaining the high-pressure vessel at the target temperature and the target pressure while exposing the silicon-containing film to the processing gas.

11. The method of claim 9, wherein the target pressure is between about 1 bar and about 70 bar.

12. The method of claim 11, wherein the target pressure is between about 5 bar to about 35 bar.

13. The method of claim 9, wherein the processing gas further comprises an oxidizer.

14. The method of claim 13, wherein the oxidizer is selected from a group of ozone, oxygen, water vapor, heavy water, a peroxide, a hydroxide-containing compound, oxygen isotopes and hydrogen isotopes.

15. The method of claim 9, wherein the target temperature is between about 400 degrees Celsius and about 500 degrees Celsius.

16. The method of claim 15, wherein the target pressure is between about 30 bar and about 40 bar.

17. A method of forming a silicon oxide film, comprising:

loading a substrate having a silicon-containing film formed thereon into a processing region of a high-pressure vessel; and forming a silicon oxide film on the silicon-containing film, comprising:

ramping a temperature of the high-pressure vessel to a target temperature between about 100 degrees Celsius and about 500 degrees Celsius and a target pressure greater than about 1 bar, wherein water is positioned in the processing region prior to ramping the temperature of the high-pressure vessel to the target temperature; and exposing the silicon-containing film to a processing gas comprising steam formed from the water.

18. The method of claim 17, further comprising maintaining the high-pressure vessel at the target temperature and the target pressure while exposing the silicon-containing film to the processing gas.

19. The method of claim 18, wherein the target temperature is between about 400 degrees Celsius and about 500 degrees Celsius.

20. The method of claim 19, wherein the target pressure is between about 30 bar and about 40 bar.

* * * * *